Figure 1:
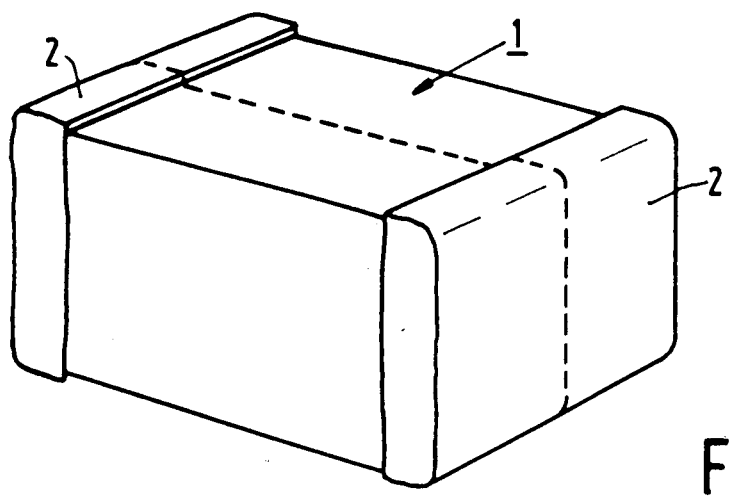

United States Patent [19]

Weekamp et al.

[11] Patent Number: 5,053,916
[45] Date of Patent: Oct. 1, 1991

[54] SURFACE-MOUNTED MULTILAYER CAPACITOR AND PRINTED CIRCUIT BOARD HAVING SUCH A MULTILAYER CAPACITOR

[75] Inventors: Johannus W. Weekamp; Pieter Kats, both of Eindhoven, Netherlands; Luc A. G. Jacques, Roeselare, Belgium

[73] Assignee: U.S. Philips Corporation, New York, N.Y.

[21] Appl. No.: 489,420

[22] Filed: Mar. 5, 1990

[30] Foreign Application Priority Data

Mar. 13, 1989 [NL] Netherlands ............ 8900594
May 19, 1989 [NL] Netherlands ............ 8901244

[51] Int. Cl.⁵ ................................ H01G 1/13
[52] U.S. Cl. ..................................... 361/308
[58] Field of Search ............... 361/308–310, 361/402, 403, 404, 323, 306, 400; 29/25.42

[56] References Cited

U.S. PATENT DOCUMENTS

| 2,442,810 | 6/1948 | Haas ................... 361/308 X |
| 2,820,934 | 1/1958 | Mullikin ............... 361/308 |
| 3,244,953 | 4/1966 | Walsh et al. .......... 361/308 X |
| 3,513,369 | 5/1970 | England et al. ........ 361/308 |
| 4,613,518 | 9/1986 | Ham et al. ........... 29/25.42 X |
| 4,672,506 | 6/1987 | Deguchi et al. ....... 361/323 |

FOREIGN PATENT DOCUMENTS

| 3425727 | 1/1986 | Fed. Rep. of Germany ...... 361/306 |
| 77910 | 3/1989 | Japan ....................... 361/308 |

Primary Examiner—Donald A. Griffin
Attorney, Agent, or Firm—Norman N. Spain

[57] ABSTRACT

A surface-mounted multilayer capacitor and a printed circuit board having such a capacitor. The capacitor comprises a multilayer of electrodes and dielectric layers which are alternately stacked. End contacts of the electrodes consist of a thin sprayed-metal layer and a U-shaped cap which engages the capacitor in a clamping manner. The sprayed-metal layer and the cap can contact each other electrically via a solder layer. Preferably, the sprayed-metal layer is impregnated with a thermocuring synthetic resin and the synthetic resin is removed from a part of the sprayed-metal layer. The capacitor preferably comprises coating layers which are cemented to the multilayer by means of an adhesive layer.

6 Claims, 2 Drawing Sheets

SURFACE-MOUNTED MULTILAYER CAPACITOR AND PRINTED CIRCUIT BOARD HAVING SUCH A MULTILAYER CAPACITOR

BACKGROUND OF THE INVENTION

The invention relates to a surface-mountable multilayer capacitor comprising a multilayer of metal layers which serve as electrodes and dielectric layers which are located between said metal layers, as well as two end contacts having a sprayed-metal layer which are located at two parallel side faces of the multilayer.

Surface-mountable devices (SMD's) are used in the so-called surface-mounting technique in which said electric devices are directly secured to "printed wiring" via the end contacts, this printed wiring comprising, for example, a substrate of hard paper or synthetic resin, having conductor tracks. Such a printed wiring is referred to as a printed circuit board (PCB).

A capacitor of the type mentioned in the opening paragraph is known from U.S. Pat. No. 4,531,268. In said specification, a description is given of a multilayer capacitor which is composed of a number of metallized synthetic resin foils. These synthetic resin foils form the dielectric layers and the metal layers form the electrodes. Two opposing side faces of the multilayer are provided with a porous metal layer by means of a metal-spraying process. Said sprayed-metal layers form the connections (end contacts) by means of which the capacitor is soldered to a PCB. The metallized synthetic resin foils are arranged so as to be alternately displaced relative to each other, in such a manner that successive electrodes of the multilayer are alternately connected to the one or the other end contact in an electrically conductive manner.

Applicants have found that there are a number of reasons why the above capacitor does not operate satisfactorily. Firstly, the sprayed-metal layers which serve as end contacts must be relatively thick, i.e., thicker than 150 $\mu$m. This relatively large thickness is required because the sprayed-metal layers also ensure the mechanical stability of the capacitor, i.e., said sprayed-metal layers hold the individual layers of the multilayer together. As metal-spraying is a relatively expensive and inefficient process this is regarded as very disadvantageous. Secondly, it has been found that sprayed-metal end contacts exhibit mediocre soldering properties. Consequently, a soldered joint between a sprayed-metal end contact and a PCB has insufficient mechanical stability and, hence, can easily be broken. This is also undesirable. Thirdly, sprayed-metal end contacts have an irregular shape. Consequently, the dimensions of, in particular, relatively small multilayer capacitors are difficult to control. In view of the ongoing miniaturization and standardization of the dimensions of SMD components, this is experienced as a problematic to an increasing serious problem.

SUMMARY OF THE INVENTION

One of the objects of the invention is to overcome the above drawbacks. The invention more particularly aims at providing a multilayer capacitor having end contacts with a relatively thin sprayed-metal layer. According to a further object, the invention provides a multilayer capacitor having properly solderable end contacts. The multilayer capacitor according to the invention also is mechanically stable and has a well-defined shape and dimensions. In particular the end contacts are firmly connected to the capacitor.

These and other objects are achieved by a multilayer capacitor of the type described in the opening paragraph, which is characterized according to the invention in that each end contact also has a metal cap which is electrically conductively connected to the sprayed-metal layer and which engages the multilayer in a clamping manner.

The mechanical stability of the capacitor according to the invention is determined mainly by the stability of the cap. For this reason, it is necessary that the preferably U-shaped cap engages the multilayer in a clamping manner. The sprayed-metal layers serve mainly to establish an electric contact between the various electrodes and the caps. Consequently, the sprayed-metal layers may be relatively thin, i.e., thinner than 125 $\mu$m. It has been found that even by means of sprayed-metal layers having a thickness below 100 $\mu$m, and even below 60 $\mu$m, a proper electric contact between the electrodes and the caps can still be obtained. The sprayed-metal layer may consist of a single layer of metal, preferably copper. Under certain conditions the sprayed-metal layer is advantageously composed of two or more sublayers. When the electrodes and the caps are manufactured from different metals or metal alloys, it is advantageous to use a sprayed-metal layer which is composed of two sublayers of different metals or metal alloys. When the electrodes of the capacitor are composed of aluminium and the caps of copper, the sprayed-metal layers suitably consist of a first sublayer of aluminum and a second sublayer of copper. The first sublayer electrically contacts the electrodes and the second sublayer electrically contacts the cap. The caps must be composed of an electrically conducting metal or metal alloy. Preferably, the caps are mainly composed of copper.

In an interesting embodiment of the capacitor according to the invention, an electrically conducting layer is arranged between the cap and the sprayed-metal layer. This conducting layer ensures that an optimum electric contact is possible between the cap and an irregular sprayed-metal layer. This conducting layer may be composed of, for example, a conducting polymer synthetic resin on the basis of a silver-containing epoxy. However, it is advantageous if the electrically conducting layer consists of solder because by using a solder layer a considerably lower contact resistance is attained than in the case that a layer of a conducting polymer synthetic resin is used. As will be explained hereinbelow, the solder is provided in liquid form between the cap and the sprayed-metal layer. If the cap consists of copper, lead-tin solder can be used suitably. When in this case the electrodes consist of aluminum, it is recommendable to use a two-layer sprayed-metal layer, a first sublayer consisting of aluminum and a second sublayer consisting of copper.

A further embodiment of the capacitor according to the invention is characterized in that the sprayed-metal layers comprise an impregnating agent, in particular, a thermocuring impregnating agent, and in that at the surface facing away from the multilayer the sprayed-metal layers are at least partly free from impregnating agent. The presence of the impregnating agent provides solder flux and other liquids and/or vapors from penetrating into the multilayer via the porous sprayed-metal layer, which would bring about corrosion of the electrodes and/or a reduction of the insulation resistance.

The penetration of liquids can take place, in particular, when capacitors are treated with a liquid cleaning agent. Customarily, printed circuit boards are subjected to such a treatment immediately after the electric components have been soldered thereon, inter alia, to remove the solder flux residue. A part of the surface of the sprayed-metal layer is cleared from impregnating agent, thereby enabling a proper electric contact between the sprayed-metal layer and the solder layer. Further it has been found that the solder bonds substantially exclusively to the part of the sprayed-metal layer from which the impregnating agent is removed. Consequently, by removing the impregnating agent the mechanical strength of the bond between the sprayed-metal layer and the cap is enhanced.

Another interesting embodiment of the capacitor according to the invention, is characterized in that the capacitor has two coating layers which are located on the underside and the upper side of the multilayer, and in that the caps engage the multilayer in a clamping manner via this coating layers. In said embodiment, both coating layers preferably consist of a single, electrically nonconducting, relatively thick synthetic resin foil. The coating layer may however also be composed of a number of dielectric layers between which there are no electrodes. The coating layers reinforce the multilayer structure and additionally have an electrically insulating function. A favorable embodiment is obtained when the caps are partly recessed in the coating layers.

As the caps engage said coating layers in a clamping manner, the thickness of the cap actually determines the dimensions of the so-called adhesive cap. This is to be understood to mean herein the distance between the coating layer and the PCB on which the capacitor is mounted. This distance is very important when the capacitor carrying the coating layer is bonded to the PCB prior to the soldering process. This is the case when the components are soldered onto the PCB by means of the so-called wave-soldering method. For reasons of stability the cap has a minimum thickness of approximately 75 µm. As this minimum thickness mostly exceeds the dimension of the adhesive gap, it is favourable to partly recess the caps in the coating layers. Alternatively, this can be attained, for example, by applying additional layers to the coating layers of the capacitor between the U-shaped caps.

A further favorable embodiment of the capacitor according to the invention is characterized in that the caps are provided with small through holes which are formed by etching. The presence of a fine-mesh pattern of these holes permits the caps to be anchored, as it were, in the coating layers by subjecting the finished products to a temperature treatment. This results in an improved bond between the caps and the coating layers and, hence, enhances the mechanical strength of the capacitor. In particular with capacitors having a thickness of less than 0.8 mm, this measure has provide very effective in realizing a firm bond between the caps and the multilayer capacitor. The pattern of holes can be formed in the caps by means of photochemical etching, holes of 100µ and a pitch of 200µ being formed. Moreover, the use of caps having small through holes facilitates the provision of a possible solder layer between the caps and the sprayed-metal layers. It has been found that the liquid solder readily passes through the holes formal which have a cross-section of, for example, 100 µm.

A further embodiment of the capacitor according to the invention is characterized in that the dielectric layers and the coating layers are composed of polyphenylene sulphide, and in that an intermediate adhesive layer is disposed between the multilayers and the coating layers. It has been found that when the dielectric layers of the multilayer and the coating layers are composed of polyphenylene sulphide, a poor adhesion between the coating layers and the multilayer is obtained. This adversely affects the mechanical stability of the finished capacitor. Moreover, said poor adhesion may bring about a capillary gap between the coating layers and the multilayer. Moisture may accummulate in this gap. This adversely affects the electrical functioning of the finished capacitor. To solve these problems an intermediate adhesive layer is used. This layer is preferably composed of polyethylene teraphthalate.

The surface-mounted capacitors according to the invention are manufactured from a so-called capacitor strip, the construction of which strip is broadly known from European Patent Application No. 184.439 (FIG. 1). Such a capacitor strip comprises an elongated multilayer of alternately stacked metal layers and dielectric layers, which is provided with ia sprayed-metal layer in two parallel longitudinal directions. It is to be noted that the strips used for the manufacture of capacitors according to the invention comprise relatively thin sprayed-metal layers. Subsequently, the capacitor strip is provided with two metal caps which are preferably U-shaped, and finally said capacitor strip is sawn in a direction transversely to the longitudinal direction to obtain individual capacitors. If desired, the capacitor strip is additionally provided with an electrically conducting layer which is disposed between the cap and the sprayed-metal layer. This layer is preferably applied by immersing the capacitor strip which is provided with metal caps in a liquid solder bath. In this case, it appears that the liquid solder penetrates easily between the caps and the sprayed-metal layers. It is assumed that this process is based on capillary suction and hydrostatic pressure. The process is accelerated by changing the atmospheric pressure during the immersion of the strip. For example, the strip may be immersed in the bath at a low atmospheric pressure or in a vacuum, after which, the vacuum is released and the strip is removed from the immersion bath.

It has proved to be advantageous to impregnate the sprayed-metal layers of the capacitor strip with a thermocuring synthetic resin before the caps are provided. Subsequently, at least a part of the surface of each sprayed-metal layer must be cleared, from this synthetic resin before the U-shaped caps are provided. This impregnating treatment renders the multilayer of the capacitor completely inaccessible to liquids and/or vapors which might cause corrosion of the electrodes and which might also reduce the insulation resistance. Electrically non-conducting, thermocuring synthetic resins which do not or hardly soften at the temperature at which the solder layer is applied can be used as the impregnating agent. In the case of Pb-Sn solder this is approximately 260° C. Impregnating means on the basis of epoxy resin have proved to be very suitable.

After the impregnating treatment the entire surface of the sprayed-metal layer is covered with a thin film of electrically nonconducting synthetic resin. In order to obtain a proper electrical contact with the solder layer, if any, and with the U-shaped cap, at least a part of the surface of the sprayed-metal layer must be cleared from the impregnating agent. This can be obtained by means of a mechanical treatment such as, for example, grinding. Preferably, however, a longitudinal groove is formed in the sprayed-metal layer of the capacitor strip.

After the U-shaped caps and the solder layer are provided, the capacitor strip is sawn into separate capacitor elements in a transverse direction. The saw cuts of the capacitor elements are preferably provided with an electrically insulating lacquer layer.

The invention also relates to a printed circuit board. This is characterized in that it is provided with at least a surface-mountable capacitor of the type mentioned in the opening paragraph, each end contact also having a metal cap which is electrically conductively connected to the sprayed-metal layer.

Figure 2:
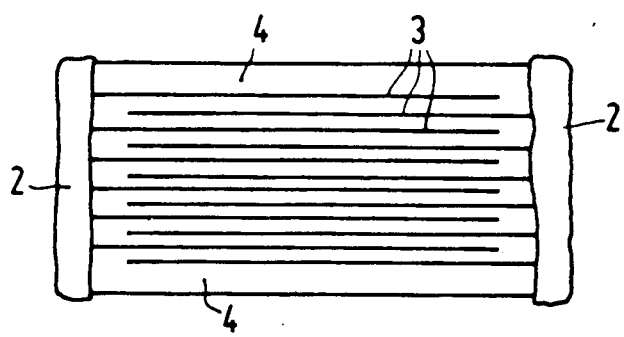
Figure 3:
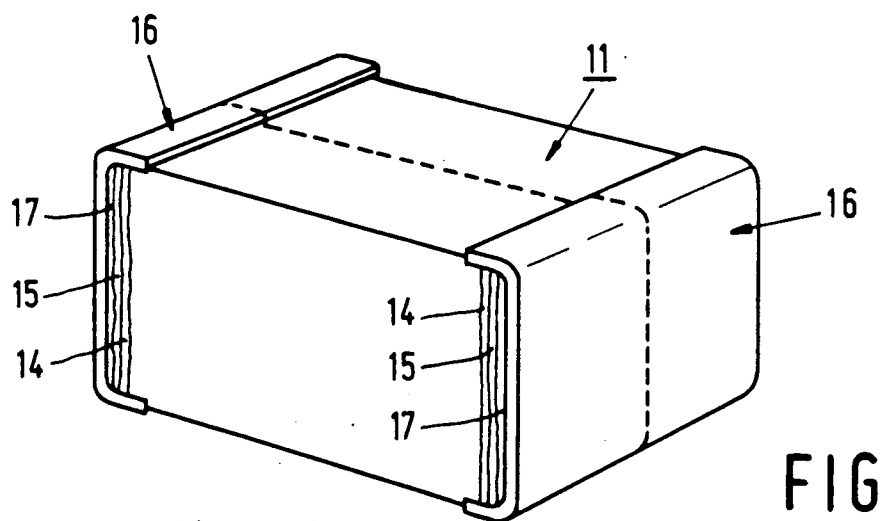
Figure 4:
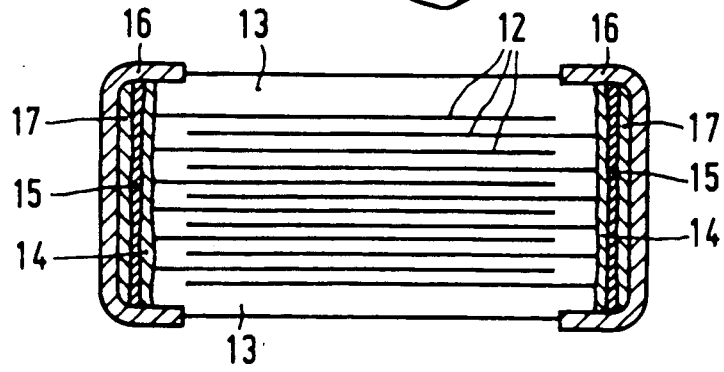
Figure 5:
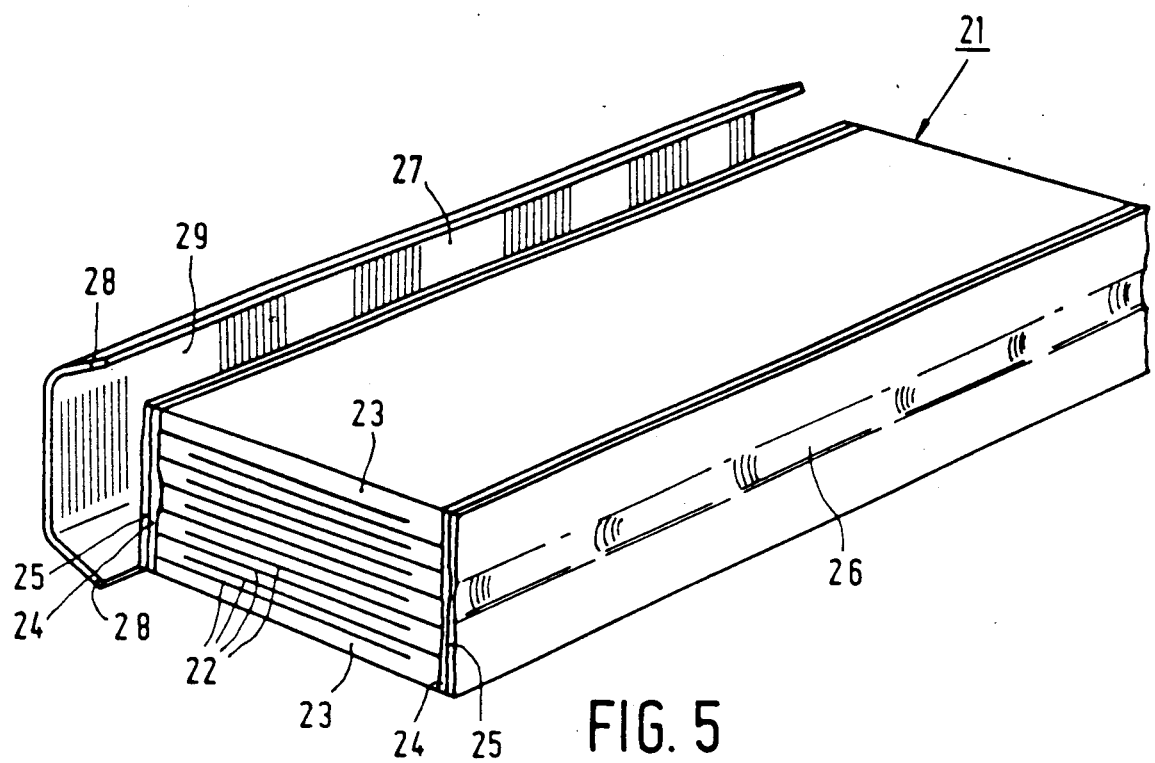
Figure 6:
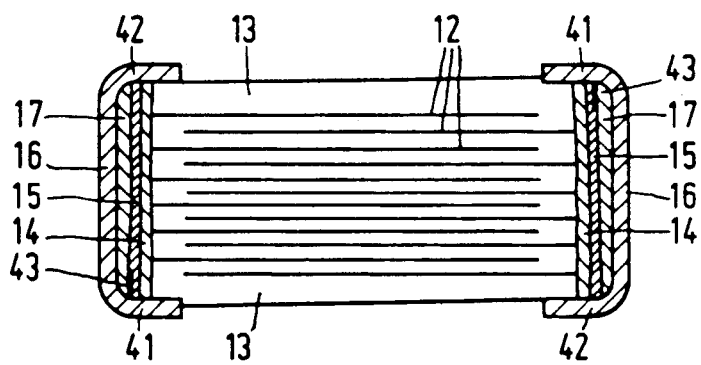
Figure 7:
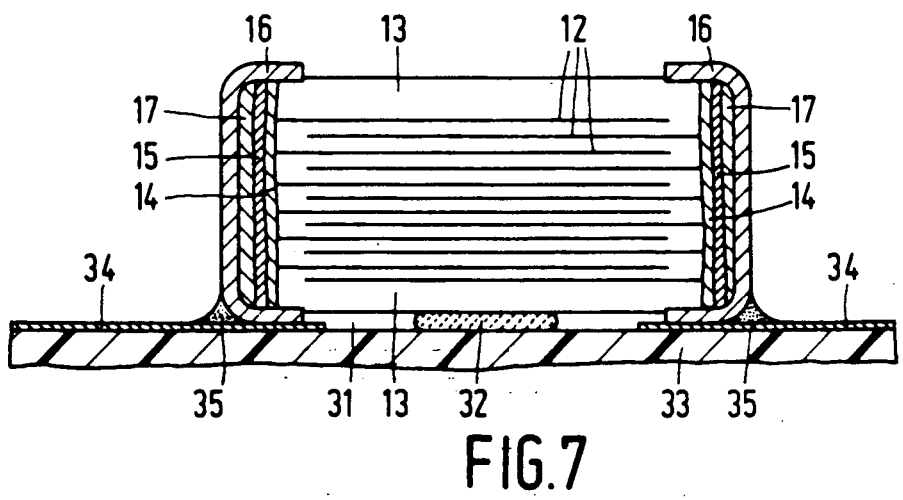

The invention will be explained in greater detail by means of exemplary embodiments and with reference to the accompanying drawing, in which FIG. 1 is a perspective view of a capacitor element according to the present state of the art, FIG. 2 is a cross-sectional view of the capacitor element shown in FIG. 1, FIG. 3 is a perspective view of a capacitor element according to the invention, FIG. 4 is a cross-sectional view of the capacitor element according to the invention as shown in FIG. 3, FIG. 5 is a diagrammatic representation of a capacitor strip with a U-shaped cap, which is provided with a longitudinal groove, FIG. 6 is a cross-sectional view of an alternative embodiment of the inventive capacitor element, FIG. 7 is a perspective view of a multilayer capacitor mounted on a printed circuitboard.

FIG. 1 is a perspective view of a known multilayer capacitor. Said capacitor comprises a capacitor body (1) which is composed of a number of alternately stacked dielectric layers and metal layers. The capacitor comprises two end contacts (2) in the form of sprayed-metal layers having a thickness of approximately 150 μm each.

FIG. 2 is a sectional view of the capacitor shown in FIG. 1. The sectional view is taken on the dotted line shown in FIG. 1. For clarity, FIG. 2 shows only a few diagrammatically represented metal electrodes (3) of the capacitor body (1). In practice, the capacitor comprises several tens to several thousands of electrodes. The individual dielectric layers arranged between the electrodes (3) are not shown. Coating layers (4) are provided on the upper side and the underside of the multilayer. These coating layers may be composed of the same material as the dielectric layers such as, for example, ceramics or synthetic resin foil. The Figure clearly shows that the successive electrodes (3), which in this case are composed of Al, are alternately secured to the one and to the other end contact (2).

FIGS. 3 and 4 respectively show a perspective view and a sectional view, taken on the dotted line shown in FIG. 3, of the capacitor according to the invention. Said capacitor comprises a capacitor body (11) which is composed of alternately stacked electrodes (12) of Al and dielectric layers of a synthetic resin foil, for example polyphenylene sulphide, PPS. In practice, a great number of layers of synthetic resin foil are stacked, which are provided with a metal layer by means of vacuum evaporation. For clarity, FIG. 4 also shows only a limited number of electrodes (12) and the dielectric layers are not shown. The coating layers (13) consist of a relatively thick synthetic resin foil, for example, of the same material as the dielectric layers. In this case, a thin adhesive layer (not shown) may be disposed between the capacitor body and the coating layers. If the dielectric layers and the coating layers are composed of PPS, a 20 μm thick adhesive intermediate layer of polyethylene teraphthalate can be used satisfactorily. A polyurethane glue can be alternatively used as the adhesive. The capacitor body is provided on both sides with a sprayed-metal layer (14, 15) having a thickness of approximately 100 μm. Said sprayed-metal layer is composed of an approximately 50 μm thick Al sublayer (14) and an approximately 50 μm thick Cu sublayer (15) which is provided thereon. A U-shaped metal cap (16) is provided around the sprayed-metal layers (14, 15) so as to engage the coating layers (13) of the capacitor in a clamping manner. The cap (16) consists of Cu and has a thickness of approximately 100 μm. The FIG. 4 clearly shows that the cap (16) is recessed in the coating layers (13). A SnPb solder layer (17) having a thickness of approximately 50 μm is disposed between the caps (16) and the sprayed-metal layers (14, 15).

The manufacture of the multilayer capacitor according to the invention is explained in more detail by means of FIG. 5. This Figure shows a capacitor strip which, is broadly known from, inter alia, FIG. 1 and the corresponding description on page 7, third paragraph of European Patent Application No. 0.184.439. On stacking the coating layers and the layers of the multilayer, an intermediate adhesive layer can be stacked along therewith as a foil in a simple manner. Along with the coating layers and the dielectric layers of the multilayer, an adhesive intermediate layer can be stacked as a foil in a simple manner. Strip (21) consists of a multilayer of stacked electrodes (22) and dielectric layers (not shown for clarity), two coating layers (23) and two sprayed-metal layers (24, 25). Both sprayed-metal layers comprise a first sublayer (24) which consists of Al and a second sublayer (25) which consists of Cu. The sprayed-metal layers (24, 25) were impregnated with a thermocuring synthetic epoxy resin on the. Subsequently, a longitudinal groove (26) was ground in both sublayers (25). Then, two elongated, U-shaped caps (27) having slightly outwardly bent limbs (28) were provided against both sprayed-metal layers (24, 25). For clarity, FIG. 5 shows only one cap (27) which is not yet provided. The caps may be provided with a fine-mesh pattern of through holes which are formed by means of photochemical etching. After the inner sides (29) of the caps (27) almost rested against the sublayers (25), the limbs (28) of the caps (27) were forced against the coating layers (23) of the capacitor strip (10) by means of a bending tool (not shown). Subsequently, the strip was immersed in a PbSn solder bath, such that the space between the sprayed-metal layers (25) and the caps (27) was filled with solder. After or before this treatment, the limbs of the caps are anchored in the coating layers under the influence of the clamping force and the increased temperature. Finally, the capacitor strip (21) was sawn in a direction transversely to the longitudinal direction to obtain separate capacitor elements according to the invention.

In a further interesting embodiment of the capacitor according to the invention, only one of both limbs of each cap is anchored in a coating layer. In this embodiment, only one cap is to be anchored in each coating layer. By virtue of the fact that the metal cap is somewhat flexible, it is achieved by means of this measure that the non-anchored limb is still slightly movable relative to the coating layer which it engages in a clamping manner. This construction provides the capacitor mounted on the PCB with a particular advantage. As the capacitor and the PCB have different coefficients of expansion, tensile stresses caused by temperature fluctuations may occur between the caps of a capacitor which are mounted on the PCB. This is the case, in particular, when the capacitor is secured to the PCB by means of wave soldering. When the caps are fixedly anchored in the coating layers with both limbs, this tensile stresses may cause one of the caps to be torn off. Consequently, the electric contact is interrupted. As in the last-mentioned embodiment one of the two caps can be moved relative to the coating layers, tensile stresses can be absorbed taken up better. Preferably, the longitudinal groove in the sprayed-metal layer is formed near the anchored limb of the caps. As the fixation of the caps to the sprayed-metal layer is carried out substantially exclusively via said groove, the flexibility of the cap is increased by this favorable location of the groove.

FIG. 6 is a sectional view of the inventive capacitor according to the last-mentioned embodiment. Parts corresponding with parts in FIG. 4 bear the same reference numerals. Cap (16) has a fine-mesh pattern of through holes. The limbs (41) of the caps (16) are anchored in coating layers (13). The limbs (42) engage said coating layers in a clamping manner. Reference numeral (43) indicates where the longitudinal groove is formed in the sprayed-metal layer (15).

Temperature fluctuations can be readily taken up because, after the capacitor has been fixed, the soldered limbs (41) and (42) of the caps can be moved relative to each other.

FIG. 7 is a sectional view of the capacitor shown in FIGS. 3, 4 and 6, after said capacitor is fixedly soldered onto a printed circuit board. FIG. 6 clearly shows the adhesive gap (31) as well as the drop of adhesive (32) by means of which the capacitor (11) is secured to the printed circuit board (33) via a coating layer (13) before the capacitor (11) is soldered. After the capacitor has been cemented, the connections (caps 16) are located on conductor tracks (34) of the printed circuit board. After the soldering process the caps are both mechanically and electrically conductively connected to the printed circuit board via soldered joints (35).

We claim:

1. A surface-mountable multilayer capacitor comprising a laminate of metal electrodes and dielectric layers located between said electrodes and two end contacts, each end contact comprising a sprayed-metal layer contacting one of two parallel side faces of the laminate, each of said end contacts having a metal cap electrically conductively connected to the sprayed-metal layer and engaging the laminate in a clamping manner and said sprayed-metal layers being provided with a thermocuring impregnating agent in a manner such that at least part of the surfaces of the sprayed-metal layers facing away from the laminate is free of said impregnating agent.

2. A surface-mountable multilayer capacitor comprising a laminate of metal electrodes and dielectric layers located between said electrodes and two end contacts, each end contact comprising a sprayed-metal layer contacting one of two parallel side faces of the laminate, each of said end contacts having a metal cap electrically conductively connected to the sprayed-metal layer and engaging the laminate in a clamping manner, said dielectric layers being formed of polyphenylene sulfide and said capacitor comprising two coating layers formed of polyphenylene sulfide, said coating layers being located on the underside and the upper side of said laminate and separated from said laminate by an adhesive layer formed of polyethylene terephthalate, and said caps contacting said laminate in a clamping manner via said coating layers.

3. A surface-mountable multilayer capacitor comprising a laminate of metal electrodes and dielectric layers located between said electrodes and two end contacts, each end contact comprising a sprayed-metal layer contacting one of two parallel side faces of the laminate, each of said end contacts having a metal cap electrically conductively connected to the sprayed-metal layer and engaging the laminate in a clamping manner and an electrically conducting layer arranged between the cap and the sprayed-metal layer, said electrically conductive layer preferably being composed of solder.

4. A surface-mountable multilayer capacitor comprising a laminate of metal electrodes and dielectric layers located between said electrodes and two non-conductive coating layers located on the underside and upper side of the laminate and two end contacts, each end contact comprising a sprayed-metal layer contacting one of two parallel side faces of the laminate and each of said end contacts having a metal cap electrically conductively connected to the sprayed-metal layer and engaging the laminate in a clamping manner via said coating layers.

5. A multilayer capacitor as claimed in claim 1, characterized in that the caps are partly recessed in the coating layers.

6. A multilayer capacitor as claimed in claim 1, characterized in that the caps are provided with small through holes which are formed by etching.

* * * * *